United States Patent [19]

Takada

[11] Patent Number: 4,855,950
[45] Date of Patent: Aug. 8, 1989

[54] OPTICAL STORAGE APPARATUS INCLUDING A REVERSIBLE, DOPING MODULATED, MULTILAYER, AMORPHOUS ELEMENT

[75] Inventor: Jun Takada, Kobe, Japan

[73] Assignee: Kanegafuchi Chemical Industry Company, Limited, Japan

[21] Appl. No.: 40,190

[22] Filed: Apr. 17, 1987

[51] Int. Cl.$^4$ .................. G11C 13/00; G11C 7/00
[52] U.S. Cl. .................. 365/113; 365/215; 365/127
[58] Field of Search .............. 365/113, 106, 127, 215, 365/163; 369/283, 286; 250/213 R

[56] References Cited

U.S. PATENT DOCUMENTS

| | | | |
|---|---|---|---|
| 3,530,441 | 9/1970 | Ovshinsky | 365/113 |
| 4,587,209 | 5/1986 | Ohno et al. | 365/113 |
| 4,637,008 | 1/1987 | Eden | 365/113 |
| 4,719,594 | 1/1988 | Young et al. | 365/113 X |

OTHER PUBLICATIONS

M. Hundhausen and L. Ley, "Model for Persistent Photoconductivity in Doping-Modulated Amorphous Silicon Superlattices", Physical Review B, vol. 32, No. 10, pp. 6655–6662, Nov. 15, 1985.

M. Hundhausen and L. Ley, and R. Carius, "Carrier Recombination Times in Amorphous-Silicon Doping Superlattices", Physical Review Letters, vol. 53, No. 16, pp. 1598–1601, Oct. 15, 1984.

J. Kakalios and H. Fritzsche, "Persistent Photoconductivity in Doping-Modulated Amorphous Semiconductors", Physical Review Letters, vol. 53, No. 16, pp. 1602–1605, Oct. 15, 1984.

J. Kakalios and H. Fritzsche, "Temperature and Excitation Dependence of the Photo-Induced Excess Conductivity in Doping Modulated Amorphous Silicon", Journal of Non-Crystalline Solids 77 & 78, (1985), pp. 1102–1104.

S. C. Agarwal and S. Guha, "Persistent Photoconductivity in Doping-Modulated Multilayers and Compensated Thin Films of Hydrogenated Amorphous Silicon", Physical Review B, 32, 8469–8479, (1985).

Physical Review Letters, vol. 53, No. 16, Oct. 15, 1984, "Persistent Photoconductivity in Doping-Modulated Amorphous Semiconductors," J. Kakalios and H. Fritzsche.

Primary Examiner—Stuart N. Hecker
Assistant Examiner—Alfonso Garcia
Attorney, Agent, or Firm—Welsh & Katz, Ltd.

[57] ABSTRACT

An optical memory comprising a doping modulated multilayer made of amorphous semiconductor, and at least two electrodes, one of the electrodes being transparent and the multilayer being sandwiched between two electrodes. Data is written by increasing the electrical conductance of the amorphous semiconductor by irradiating it with light. Data is erased by the application of a bias voltage to the electrodes and also by irradiating the amorphous semiconductor with light having photon energy of approximately half or less of the optical energy band gap of the amorphous semiconductor. The memory effect can be maintained for a week or longer, and the memory can be erased without heating the memory device, whereby the lifetime of the device is lengthened.

20 Claims, 5 Drawing Sheets

OPTICAL STORAGE APPARATUS INCLUDING A REVERSIBLE, DOPING MODULATED, MULTILAYER, AMORPHOUS ELEMENT

BACKGROUND OF THE INVENTION

The present invention relates to an optical memory system and more particularly to an optical memory system wherein the memory write is carried out by the use of a change of electrical characteristic in a memory medium due to the light irradiation and the recorded data is erased by the application of a bias voltage across the memory medium.

In the prior art, optical memories have been extensively used for image input, image recording, and other forms of data storage. Among these prior art optical memories, those utilizing compounds containing chalcogenide atoms such as Cd, Se or S are widely used because it allows repeatable write and erase. In optical memories utilizing chalcogenide compounds, data is written and erased by means of a laser. However, these optical memories based upon chalcogenide compounds require that a laser device be mechanically scanned during the memory write and erase cycles. In addition, the chalcogenide compound used in the optical memory is fatigued by the repeated heating by the laser, and the written data can only be held for a few hours.

There has also been proposed a co-planar type optical memory comprising a substrate, a doping modulated multilayer film made of amorphous semiconductor formed on the substrate, and two opaque electrodes provided on the surface of the multilayer film. This co-planar type of optical memory cannot be erased except by heating the device because a potential barrier perpendicular to the surface of the multilayer film cannot be controlled from the outside. Further, the recording density is low because the electrodes are arranged in a horizontal direction with respect to a surface of the multilayer film.

It is accordingly an object of the present invention to provide a novel optical memory which permits storage of information by means of a change of electrical characteristic due to exposure to light and permits erasure of the information by application of a bias without heating.

It is another object of the present invention to provide a novel optical memory which enables the data write and erase without using a laser whereby the whole surface of the device can simultaneously be written.

It is yet another object of this invention to provide a novel optical memory which enables the storage of written or recorded memory for many hours.

It is yet another object of this invention to permit the production of novel optical memories having a large area and high recording density.

Briefly, according to one embodiment of the invention, an optical memory device is providing for storage of information. A storage means is utilized which changes for an extended period from a first value of an electrical characteristic to a second value of the characteristic in response to exposure to activating light of a selected frequency and which returns to the first value in response to application of a restore bias voltage across the storage means. A plurality of electrodes is coupled to the storage means, at least one of which is transparent to the light. The electrodes are configured such that the storage means is sandwiched between the transparent electrode and at least one other of the plurality of electrodes. In one alternative embodiment, the storage means comprises a doping modulated multilayer amorphous semiconductor.

BRIEF EXPLANATION OF THE DRAWINGS

The invention, together with further objects and advantages thereof, may be understood by reference to the following description taken in conjunction with the accompanying drawings.

DETAILED DESCRIPTION

Figure 1:
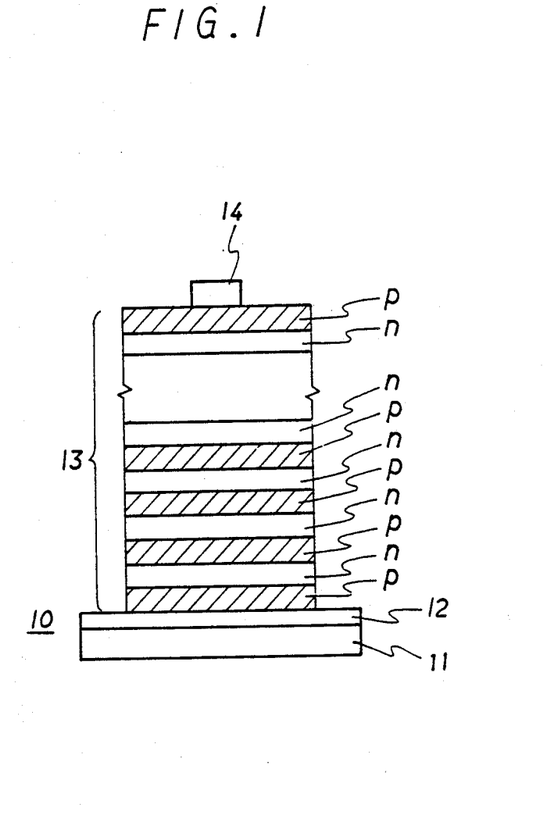
FIG. 1 is a schematic sectional view illustrating a specific embodiment of an optical memory according to the present invention.

FIG. 1 is a schematic sectional view of a specific embodiment of an optical memory device 10 according to the present invention. The optical memory device 10 comprises a substrate 11 on which an electrode 12 resides. The electrode 12 is coupled to the bottom of an amorphous semiconductor element 13 and an electrode 14 is coupled to the top, as shown.

In the illustrated embodiment of the present invention, at least one of the electrodes, such as the electrode 14 is transparent. The amorphous semiconductor element 13 is a doping modulated multilayer (hereinafter referred to as "multilayer") comprising p-type layers and n-type layers deposited alternately. The multilayer 13 may also be a super lattice structure. Multiple memory devices 10 may be formed on a single multilayer amorphous semiconductor element 13 forming an array of memory cells on a single larger semiconductor element.

In the illustrated embodiment, the amorphous semiconductor may for example comprise hydrogen and at least one element of the Periodic Table Column IVA such as Si, Ge, Sn, and C; or an amorphous semiconductor containing microcrystals therein (e.g., a-Si:H, a-SiC:H, a-SiGe:H, a-SiSn:H, a-SiN:H, and microcrystallized a-Si:H, a-SiC:H, a-SiGe:H, a-SiSn:H, a-SiN:H, and the like, where a —indicates amorphous material). Other semiconductors, including molecular semiconductors, may be used as well.

The multilayer 13 may be a repeating, doping modulated structure of pnpn...pnp, or a repeating doping modulated structure of pinpin...pinp (where p is p-type doping, i is an insulator composed of undoped semiconductor and n is n-type doping) or other similar repeating, doping modulated structures. The preferable thickness of the p-type layer or n-type layer varies depending on the band gap, the density of states between gaps, the Fermi level, and the like. The amorphous semiconductor may be doped using an element of the Periodic Table Column VA such as phosphorous for an n-type layer or an element of the Periodic Table Column IIIA such as boron for a p-type layer.

In the illustrated embodiment, a p-type layer or an n-type layer in an amorphous semiconductor material comprising for example a-Si:H (gas ratio: $PH_3/SiH_4=B_2H_6/SiH_4=10^{-4}$), the thickness is preferably from 200 to 1000 Angstroms (but may range from less than 50 to more than 2500 Angstroms). If the thickness of the p-type layer or n-type layer is much less than 50 Angstroms, the potential barrier at a p/n interface is lowered and the charge separation effect is sometimes reduced. However, when the layers are more than 5000 Angstroms, the memory write and erase effect for the device 10 is reduced and the manufacturing time is lengthened. The thickness of an i-type layer is preferably from 3 to 1000 Angstroms, although devices may be fabricated with i-type layers greater than 1000 Angstroms.

A memory device 10 using a combination of p-type layer and n-type layers may be fabricated with any number of layers but in the illustrated embodiment the total number of layers is preferably from 3 to 1000. When the total number of layers is less than 3, the memory effect cannot be expected since a potential well is not formed. Maximum memory effect can be achieved by increasing the number of potential wells by accumulating more than 5 p-type layers and 5 n-type layers alternately and frequently. In addition, further improvement is achieved by utilizing one more p-type layer than n-type layer (e.g., 9 p-type layers, 8 n-type layers). This arrangement maximizes the number of closed potential wells thereby maximizing the memory effect.

The total thickness of the multilayer is preferably from about 1000 Angstroms to about 10 μm, because a certain degree of thickness is required order to allow a accurate measurement of electrical conductance without excessive variations due to thickness variations.

In a memory device 10 utilizing a combination of p-type layers, i-type layers and n-type layers, the total number of layers is preferably from 5 to 1000 in the illustrated embodiment. When the total number of layers is less than 5, sufficient potential wells are not formed to obtain maximum memory effect. When there are more than 1000 layers, the manufacturing time increases the expense of fabrication. The total thickness of a pin-type multilayer is preferably from 1000 to 100000 Angstroms.

A wide variety of materials may be used for the substrate 11, which is preferably a rigid material to which the electrode and/or semiconductor can easily adhere (e.g., glass, sapphire, heat resisting polymer film, ceramics, and the like).

In the illustrated embodiment of the present invention, at least one of the electrodes 12, 14 is made of transparent conductive material to permit activating light to be transmitted through the electrode to the semiconductor material (e.g., $SnO_2$, $SnO_2$:F, ITO [Indium Tin Oxide], $Z_nO$ and a combination of $SnO_2$ [semiconductor side] and ITO). The electrodes not having transparency may be made of any of many widely known suitable conductive materials, primarily metals, such as Au, Pt, Pd, Ni, Cr, Co, Mg, Al, Ag, Mo, Ta, Fe, W, Cu or alloys thereof (for example stainless steel, nichrome, and the like). Among these, Ag, Cu or Al are preferably due to their high reflectivity which enhances internal reflection of light. The lifetime of the device can be lengthened by interposing a conductive diffusion-blocking layer, preferably transparent, between a semiconductor and an electrode, especially a metal electrode. Such diffusion-blocking layer is disclosed in Japanese Patent Publications No. 26268/1986, No. 91973/1986 and No. 91974/1986. Such a transparent layer prevents destructive diffusion from the electrode into the semiconductor while allowing light to reflect off the metal electrode.

A wide range of thickness of electrodes 12, 14 may be used, however, it is preferable that the electrode have a thickness from about 500 to about 10000 Angstroms in order to provide adequate mechanical strength while minimizing cost.

To fabricate the optical memory device 10 illustrated, an electrode 12 is deposited on the substrate 11 by means of any of a variety of well-known deposition techniques, such as sputtering. A p-type layer of the multilayer semiconductor element 13 may be formed on the electrode 12, utilizing, for example an rf glow discharge decomposition method, using a mixture of gas consisting of, for example, $SiH_4$ and $B_2H_6$ (forming a-si:H doped with B), or some other well known method such as the sputtering method, the photo chemical vapor deposition (CVD) method, and the like. An n-type layer is formed in the same manner as a p-type layer except that the mixture of gas used consists of, for example, $SiH_4$ and $PH_3$ (forming a-Si:H doped with P).

A multilayer is thus obtained by alternately forming a p-type layer and an n-type layer (i.e. to obtain a construction of pnpn...pnp), each layer having substantially equal thickness. The doping level, which varies depending on the kind of amorphous semiconductor, usually controlled to a range of $10^{-5}$ atom % to 5 atom %. When the doping level is less than $10^{-5}$ atom % or more than 5 atom %, the memory effect may be lowered.

In the illustrated embodiment, data is written by irradiating a red light or a light having a similar wavelength with an intensity of approximately 1 to approximately 1000 mW/cm$^2$ on to a device having zero bias across it. Suitable light can have wavelength falling in a range from infrared to ultraviolet light depending upon semiconductor material and thickness. A light source is selected to provide a high level of absorption while maintaining sufficient penetration so that the semiconductor element 13 is uniformly exposed to the light. After the light irradiation, the electrical conductance of the semiconductor element is increased by 100 times to 1000 times and remains so for an extended period (i.e., a week or more).

This change of electrical characteristic is utilized for storage of data. Thus, for example, the high conductance level can be considered a logical high level (i.e., a binary one) and the low conductance level can be considered a logical low (i.e., a binary zero) or vice versa. Thus digital data storage is provided. Analog optical storage may also be accomplished based on the actual magnitude of conductance change which is dependent upon the intensity of the incident light as well as the time of exposure. The optical memory of the present invention can maintain the written condition for more than one week at a room temperature, while conventional optical memories lose such condition in about an hour.

Data can be most efficiently written by applying a zero bias voltage to the device during irradiation, but can also be written less effectively with a net bias voltage applied. When not applying a bias, the ratio of the change of the electrical conductance (current value after light irradiation/current value before light irradiation) becomes maximum. Thus, the application of a bias voltage during exposure to light can be used to inhibit writing. Thus, a full array of memory cells can be exposed to light to write data to some cells while inhibiting writing to selected cells by applying a bias to the selected cells. A laser may also be employed in writing data, but coherent light is not required.

The optical memory device 10 can be erased by heating the device at not less than 100° C. However, this mode of erasure (i.e., restoring the original conductance by heat alone) requires such high temperatures that it can damage nearby semiconductor devices and shorten the life of the optical memory device itself. The optical memory device 10 can also be erased at a low temperature (without any heating) by the application of a bias voltage across the device. The best results are obtained when a bias of not less than 0.1 volt per one junction is applied.

The optical memory device 10 can also be erased by irradiating with light having photon energy of approximately one-half or less of optical band gap energy of the amorphous semiconductor material constituting the multilayer of the device. More efficient erasure can be obtained if this light is used while applying a bias across the device. Thus, for example, a laser could be used to simultaneously irradiate and heat the device while a bias is applied to result in very efficient erasure.

It is desirable in the illustrated embodiment to write a memory by light irradiation without the application of a bias voltage to obtain maximum photon carrier separation, and to erase the memory by applying a bias voltage of about 1 volt per junction while heating the device to about 60° C. above ambient temperature. A higher bias voltage is generally desirable to get faster erasure so long as the voltage is not so high that the service junctions suffer breakdown. The optical memory device 10 can be written and erased repeatedly under these conditions.

As a specific example of the illustrated embodiment, an optical memory device 10 may be constructed using a transparent electrode of 800 Angstroms thick comprising ITO (Indium Tin Oxide) on a glass substrate 1 mm thick (e.g., corning glass 7059 whereon ITO is coated). On the transparent electrode, a p-type amorphous semiconductor layer of 500 Angstroms thick and an n-type amorphous semiconductor layer of 500 Angstroms thick may be formed, using a mixture gas of $SiH_4$ and $B_2H_4$ ($B_2H_6/SiH_4=10^{-4}$) and a mixture gas of $SiH_4$ and $PH_3$ ($PH_3/SiH_4=10^{-4}$) respectively, by mean of the rf glow discharge decomposition method (using a substrate temperature of 250° C. and reaction chamber pressure of 0.1 Torr.).

This procedure may be repeated to form a multilayer comprising 17 semiconductor layers (9 p-type layers and 8 n-type layers) having a construction of pnpn...pnp. This film formation can be performed in a reaction chamber with a shutter to protect a sample from contamination when exchanging a reaction gas. After the formation of the multilayer, a set of four 0.196-sq-cm metal electrodes made of NiCr may be deposited on the multilayer.

Figure 2A:
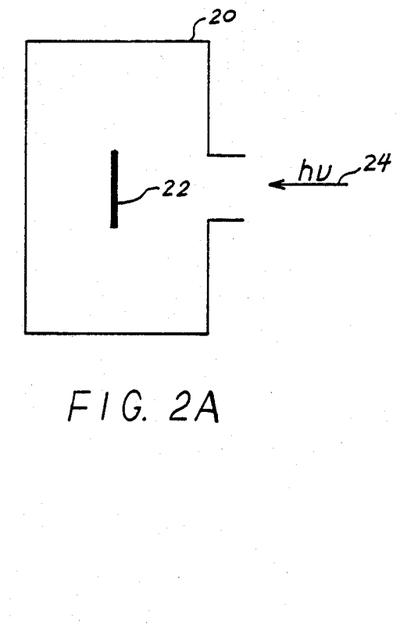
FIGS. 2A and B are schematic views illustrating the irradiation of a device according to the invention and the shielding of the device from light for making dark measurements.
Figure 2B:
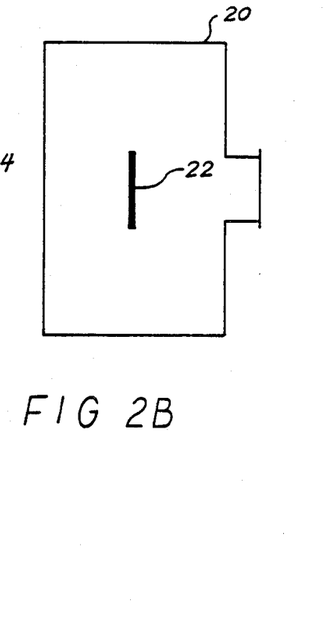

Using this specific structure as described above, as illustrated in FIG. 2A, a memory write can be carried out by irradiating a memory device 22 with a red light 24 having an intensity of about 50 mW/cm² a zero biased device. After the light irradiation for a prescribed time (i.e. for one minute, two minutes, or twelve minutes), the light irradiation is stopped and the short-circuited device is kept in a closed opaque container 20 as illustrated in FIG. 2B to permit measurement of dark current (i.e., the current when no light is incident on the device).

Figure 3:
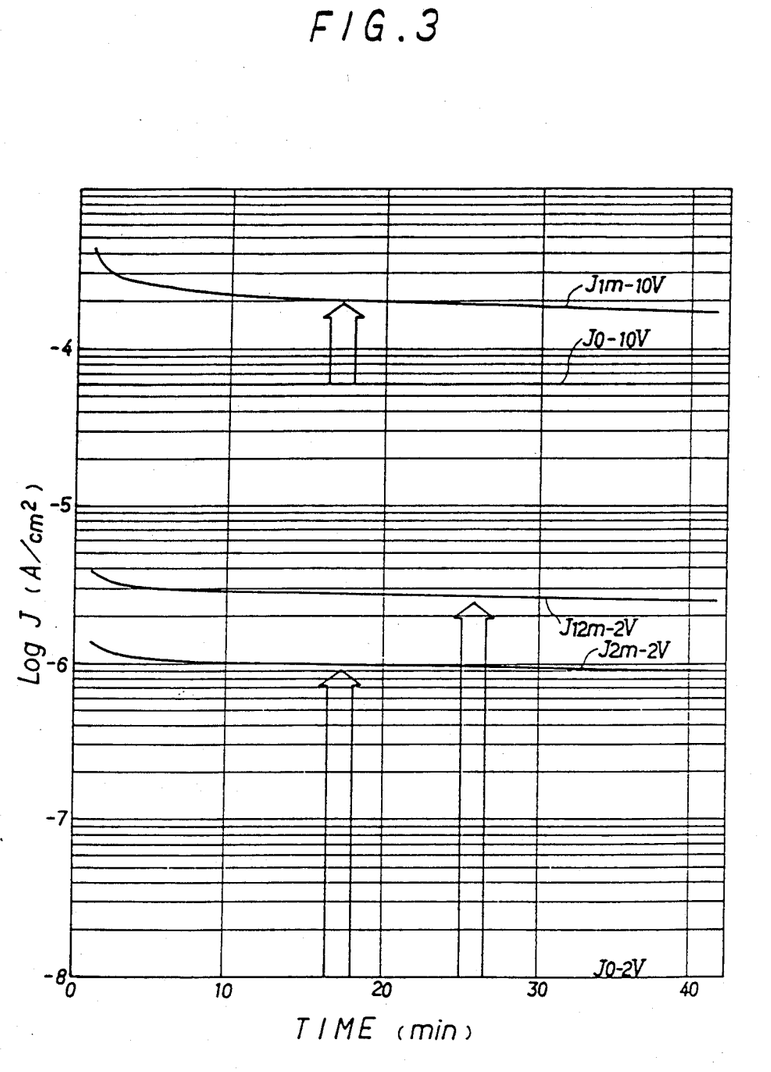
FIG. 3 is a graph illustrating the increase in conductance of a specific embodiment of an optical memory according to the invention due to exposure to light.

FIG. 3 illustrates in graphic form measured values showing the change of dark current after one minute had passed after the light irradiation. The values shown were measured after 2 minute and 12 minute exposures while applying a 2 volt measurement bias ($J_{2m-2v}$, $J_{12m-2v}$) and after a 1 minute exposure with a 10 volt bias voltage ($J_{1m-10v}$) for measurement. The light irradiation and the measurement of dark current were carried out at a room temperature. In FIG. 3, the value of dark current with a 2 volt measuring voltage ($J_{0-2v}$) and with a 10 volt measuring voltage ($J_{0-10v}$) of the device before the light irradiation are also shown.

Figure 4:
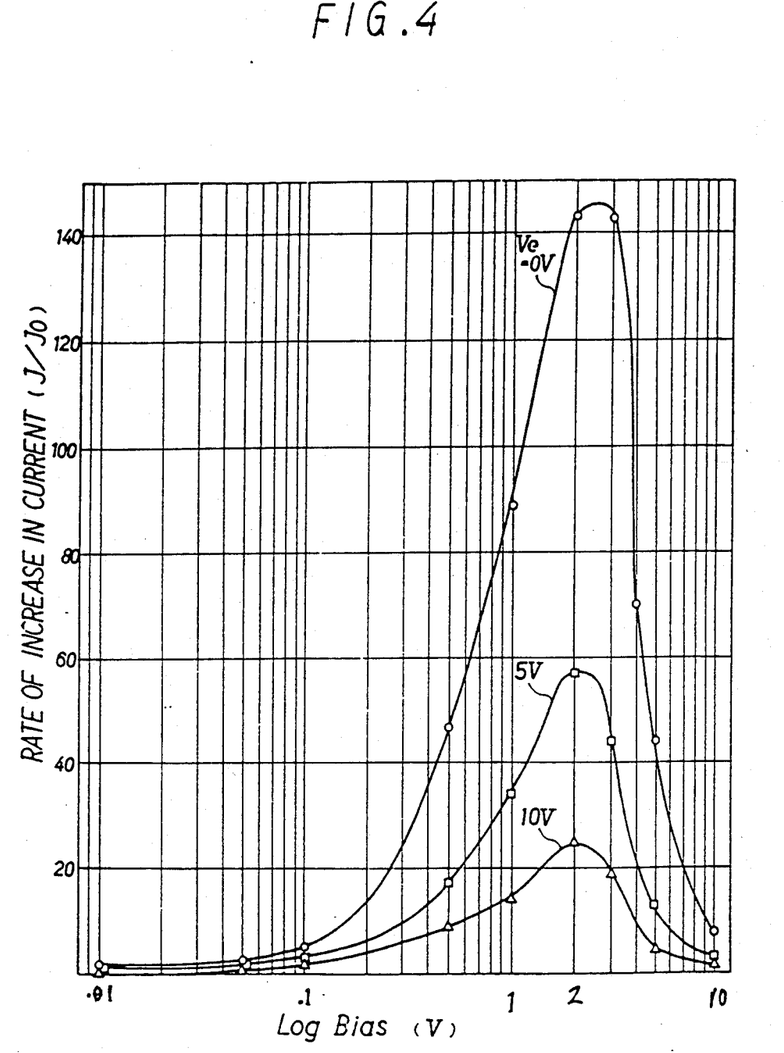
FIG. 4 is a graph illustrating a relationship between the rate of increase in current due to a light irradiation and various values of bias voltage used for measurement.

Illustrated in FIG. 4 are measured value which show a relationship between a rate of increase in current ($J/J_o$, J: current after light irradiation, $J_o$: current before light irradiation) due to light irradiation and the value of bias voltage for measurement. In FIG. 4, Ve means the value of irradiation bias voltage (0 volt, 5 volts, and 10 volts) applied to the device during the memory write. As can be seen in FIG. 4, the rate of increase in current $J/J_o$ and thus in conductance) is maximum when the measurement bias voltage is 2 volts, (i.e. a voltage per junction is 0.13 volt) and the irradiation bias voltage (Ve) is 0 volt. Further, a relationship has been found between the rate of increase in current ($J_o/J_{oe}$, where $J_{oe}$ is the current after exposure with a zero bias during exposure) and the value of bias voltage (Ve) applied to a device during the memory write. With a bias voltage for measurement of 2 volts, and the rate of increase in current based on the current value when Ve is 0, the relationship is given by a formula $J=J_{oe}\ e^{-(V_j/0.34)}$ (wherein $v_j$ is a value of bias voltage per junction.

FIG. 3, shows that the written state of an optical memory of the present invention is stable and holds for a long period of time. FIG. 4, illustrates that the memory effect is maximum (i.e., the change of electrical characteristic is maximum) when the applied bias voltage is 0 volt and when the measuring bias is 2 volts. As can be seen in FIG. 4, the factor of increase in current when bias voltage is 0 volt exceeds 140.

Figure 5:
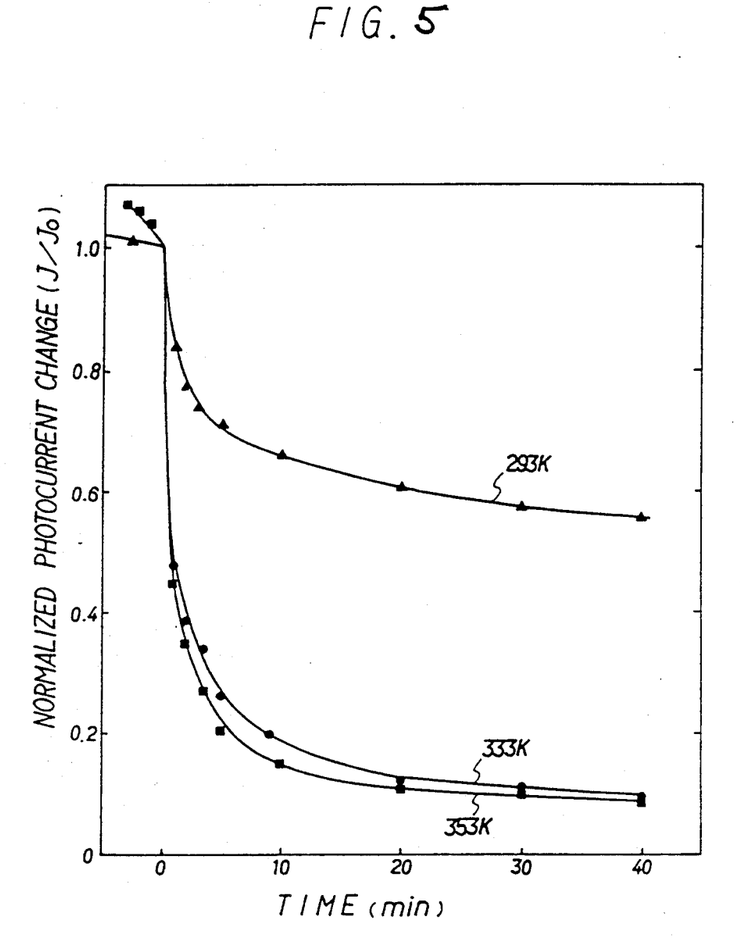
FIG. 5 is a graph illustrating the return to a lower conductance due to the application of a bias voltage and heat to a specific embodiment of the optical memory according to the invention.

FIG. 5 illustrates the memory erase characteristics of an above-described example when applying a bias to the device. The bias voltage (i.e., the restore bias which causes the previous conductance state to be restored) applied to a device on the memory erase was 16 volts, and the dark current was measured using a 2.0 volt measuring bias. In FIG. 5, the cumulative time of the application of the 16 volt bias is plotted against the rate of increase in dark current normalized by the value of dark current when the application of bias starts. The three curves in FIG. 5 illustrate a return to lower conductance measured at temperatures of 293° K, 333° K, and 353° K. From FIG. 5 it can be seen that the memory of the device can be erased by the application of a bias voltage to the device. In addition, the memory of the device can be erased in a shorter time and more effectively by heating the device while applying an erase bias.

Thus, in the illustrated embodiment, an optical memory of the present invention has a construction wherein a multilayer is sandwiched between a transparent electrode and a metal electrode. This structure permits storage of information based upon a change of state of the multilayer due to the light irradiation (e.g., a change of electrical conductance in the illustrated embodiment). The written memory is stable at a room temperature for more than one week. In addition, the optical memory of the present invention is highly durable because the written memory can be erased by the application of a bias voltage to the device without heating to high temperature. This permits extended life since the device is not fatigued by large temperature changes.

Further, since the electrodes are so arranged that a multilayer is sandwiched between electrodes in a direction of light incidence, a larger effective area can be obtained in comparison with a co-planar type optical memory having the same area as in the present invention. The current values attained are also larger because the distance between electrodes is small and accordingly the electrical resistance is lowered. Also, due to the sandwich type arrangement, a denser configuration of electrodes can be realized to permit a larger number of memory cells in a multiple memory array on a single semiconductor element. For example, if an area of one electrode is 2-sq-nm, there can be produced a device having $25 \times 10^6$ electrodes per 1 cm$^2$. In addition, since an optical memory of the present invention is made of amorphous semiconductor, a device of large area (e.g., an area of 1-sq-m) can be produced.

Specific embodiments of the novel optical memory system according to the invention have been described for the purpose of illustrating the manner in which the invention may be made and used. It should be understood that implementation of other variations and modifications of the invention in its various aspects will be apparent to those skilled in the art, and that the invention is not limited by the specific embodiments described. It is therefore contemplated to cover by the present invention any and all modifications, variation, or equivalents that fall within the true spirit and scope of the basic underlying principles disclosed and claimed herein.

What we claim is:

1. An optical memory device for storage of information comprising:
   storage means comprising a reversible doping modulated multilayer amorphous semiconductor element for changing for an extended period from a first value of an electrical characteristic to a second value of said electrical characteristic in response to exposure to activating light of a selected frequency and for returning to the first value in response to application of a restore bias voltage across the storage means;
   at least a pair of electrodes, at least one of which is transparent to the light, coupled to the storage means and configured such that the storage means is sandwiched between the transparent electrode and at lease one other of the electrodes.

2. The memory device of claim 1 wherein the storage means comprises means for changing from the second value to the first value in response to an increase in temperature.

3. The memory device of claim 1 wherein the storage means comprises means for changing from a first value of conductance to a second value of conductance in response to exposure to the activating light and for returning to the first value in response to application of the restore bias voltage across the storage means.

4. The memory device of claim 1 further comprising a transparent protective interface between the storage means and at least one of the electrodes.

5. The memory device of claim 1 wherein all of said electrodes are transparent.

6. The memory device of claim 1 wherein the storage means comprises means for changing responsive to light having a frequency selected from the range of infrared to ultraviolet light.

7. The memory device of claim 1 wherein the storage means comprises a doping modulated multilayer amorphous semiconductor.

8. The memory device of claim 1 wherein the storage means comprises means for inhibiting the change from the first value of the electrical characteristic to the second value by the application of a bias across the storage means during exposure to the activating light.

9. The memory device of claim 1 wherein the storage means comprises means for changing from the second value of the electrical characteristic to the first value at an increased rate in response to an increase in temperature during application of the restore bias.

10. The memory device of claim 1 wherein the storage means comprises material having a characteristic optical energy band gap and which changes from the second value of the electrical characteristic to the first value in response to exposure to light having photon energy of less than approximately one half of the optical energy band gap of the storage means.

11. The memory device of claim 1 further comprises laser means for irradiating the storage means with activating light.

12. The memory device of claim 10 further comprising light generating means for irradiating the storage means with light having an intensity sufficient to increase the temperature of the storage means and having a photon energy of less than approximately one half of the optical energy band gap of the storage means.

13. The memory device of claim 12 wherein the light generating means is a laser.

14. A method for storage of data in an optical memory comprising a reversible doping modulated multilayer amorphous semiconductor element having a characteristic optical energy band gap and having at least a pair of electrodes coupled to the semiconductor element, the method comprising the steps of:
   storing data by changing an electrical characteristic of the semiconductor element for an extended period by exposing the semiconductor element to light; and
   erasing data by applying an erase bias voltage across the semiconductor element.

15. The method of claim 14 wherein at least one electrode is transparent, and wherein the step of storing data comprises exposing the semiconductor element to light transmitted through the transparent electrode.

16. The method of claim 15 further comprises the step of inhibiting storing of data by applying an inhibit bias voltage across selected electrodes during exposure of the semiconductor element to light.

17. The method of claim 15 wherein the step of erasing further comprises the steps of heating the semiconductor element to a selected temperature above ambient temperature during application of the erase bias voltage.

18. The method of claim 17 wherein the selected temperature is between 30° C. and 100° C. above ambient temperature.

19. The method of claim 14 wherein the step of erasing further comprises exposing the semiconductor element to light having photon energy of less than approximately one half of the optical energy band gap of the semiconductor element.

20. A method of storing and erasing data in an optical memory comprising a reversible doping modulated multilayer amorphous semiconductor element having a characteristic optical energy band gap and having at least a pair of electrodes coupled to the semiconductor element, the method comprising the steps of:

changing an electrical characteristic of the semiconductor element for an extended period by exposing the semiconductor element to light having photon energy approximately greater than the optical energy band gap of the semiconductor element; and, restoring the electrical characteristic of the semiconductor element by exposing the semiconductor element to light having photon energy less than approximately one half of the optical energy band gap of the semiconductor element.

* * * * *